(12) United States Patent
Tanaka

(10) Patent No.: US 6,994,887 B2
(45) Date of Patent: Feb. 7, 2006

(54) CHEMICAL VAPOR DEPOSITION APPARATUS AND FILM DEPOSITION METHOD

(75) Inventor: Masahiko Tanaka, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/047,725

(22) Filed: Feb. 2, 2005

(65) Prior Publication Data

US 2005/0170090 A1 Aug. 4, 2005

(30) Foreign Application Priority Data

Feb. 3, 2004 (JP) ............................. 2004-026428

(51) Int. Cl.
*C23C 16/44* (2006.01)
(52) U.S. Cl. .............................. 427/248.1; 427/255.23; 118/715
(58) Field of Classification Search ............. 427/248.1, 427/255.23; 118/715
See application file for complete search history.

(56) References Cited

U.S. PATENT DOCUMENTS 5,874,366 A * 2/1999 Sporer et al. ............... 438/748

FOREIGN PATENT DOCUMENTS

| JP | 07-122507 | | 5/1995 |
| JP | 07122507 A | * | 5/1995 |
| JP | 09-246192 | | 9/1997 |
| JP | 09246192 A | * | 9/1997 |

* cited by examiner

*Primary Examiner*—Timothy Meeks
*Assistant Examiner*—Howard Abramowitz
(74) *Attorney, Agent, or Firm*—McDermott Will & Emery LLP

(57) ABSTRACT

A chemical vapor deposition apparatus has a vacuum processing chamber, a susceptor for holding a plurality of substrates each placed with a film deposition surface thereof facing downward; a heater disposed above the susceptor; a first barrier gas supply port for supplying a barrier gas to the upper surface of the susceptor; and a second barrier gas supply port for supplying the barrier gas to the upper surface of the heater. The barrier gas supplied from the first barrier gas supply port and the barrier gas supplied from the second barrier gas supply port have their flow rates controlled independently. By properly setting the ratio between the amount of the barrier gas supplied from the first barrier gas supply port and the amount of the barrier gas supplied from the second barrier gas supply port and the ratio between the amount of the barrier gas supplied and the amount of a raw material gas supplied, it becomes possible to form a film which is reduced in the number of particles adhered thereto.

3 Claims, 3 Drawing Sheets

CHEMICAL VAPOR DEPOSITION APPARATUS AND FILM DEPOSITION METHOD

The present application claims priority under 35 U.S.C. § 119(a) to Japanese Patent Application JP 2004-26428, filed Feb. 3, 2004, the entire contents of which are incorporated herein by reference.

BACKGROUND OF THE INVENTION

1. Technical Field to which the Invention Pertains

The present invention relates to a chemical vapor deposition apparatus for batch processing a plurality of substrates and a film deposition method using the same.

2. Prior Art

A chemical vapor deposition (CVD) apparatus allows the formation of thin films such as a semiconductor film, a metal film, and an insulating film with high controllability and is therefore indispensable to a fabrication process for a semiconductor device.

FIG. 4 is a cross-sectional view showing a structure of a conventional chemical vapor deposition apparatus. The apparatus shown herein is a metal organic chemical vapor deposition (MOCVD) apparatus for growing a semiconductor layer by using, in particular, a metal organic compound and a reactive gas as raw materials.

As shown in FIG. 4, in the conventional MOCVD apparatus, a gas mixture (raw material gas) of an organic metal compound, phosphine ($PH_3$), arsine ($AsH_3$), and the like is introduced into a vacuum processing chamber 104 from a raw-material-gas inlet pipe 106. Since substrates 103 each fixed to a tray 112 in a susceptor 102 with one principal surface thereof facing downward have been heated by using heaters 111, the raw material gas introduced into the vacuum processing chamber 104 undergoes a thermo-chemical reaction on the downwardly facing principal surface of each of the substrates 103. This causes the deposition of a thin film made of a semiconductor or the like.

When a flow of the raw material gas directed toward one of exhaust pipes 108 is disturbed, a reaction product adheres in the form of particles (particulates) to the substrates 103. To prevent the adhesion of the particles, the conventional MOCVD apparatus supplies a barrier gas from the upper center portion of the vacuum processing chamber 104. The barrier gas has its flow rate controlled by using a single MFC (mass flow controller) and is branched in the upper center region of the vacuum processing chamber 104 to be supplied to the center portion and outer peripheral portion thereof. The barrier gas supplied to the center portion flows between the heaters 111 and the susceptor 102 to be exhausted from the exhaust pipes 108, while the barrier gas supplied to the outer peripheral portion flows over the heaters 111 to be exhausted from the exhaust pipes 108.

As examples of a barrier gas supply method, there have also been a method which supplies a barrier gas from a center pipe composed of multiple pipes (see, e.g., Japanese Laid-Open Patent Publication No. HEI 9-246192) and a method which supplies an inert gas along the side surfaces of the vacuum processing chamber 104 (see, e.g., Japanese Laid-Open Patent Publication No. HEI 7-122507).

SUMMARY OF THE INVENTION

Thus, in each of the conventional chemical vapor deposition apparatus, the particles are less likely to adhere to the inner wall of the vacuum processing chamber 104 and to the substrates 103 owing to the barrier gas. In the case where the barrier gas is supplied in branched relation to the center portion and to the outer peripheral portion in accordance with the conventional method, the amount of the barrier gas supplied to the center portion is reduced so that the raw material gas leaks upwardly into the space over the susceptor 102 through the gaps between the trays 112 and the substrates 103. This causes the formation of a reaction product on the surfaces of the heaters 111 and also disturbs the flow of the raw material gas in the space between opposing plates 105 and each of the thin-film deposition surfaces of the substrates 103 and the lower surface of the susceptor 102. The deposition of the reaction product on the heaters 111 degrades the accuracy of temperature control in the vacuum processing chamber 104 so that high-quality thin films are not deposited any more. The disturbance of the flow of the raw material gas causes the delamination of the reaction product adhered to the opposing plates 105 and further adhesion of the reaction product that has been scattered by the turbulent to the thin-film deposition surfaces of the substrates 103. There have also been cases where the raw material gas partly flows to the upper portion of the sidewall of the vacuum processing chamber 104 so that the reaction product adheres thereto. Therefore, it has been difficult on some occasions to form high-quality thin films with the conventional chemical vapor deposition apparatus.

It is therefore an object of the present invention to provide a chemical vapor deposition apparatus which allows the deposition of high-quality thin films by preventing the adhesion of the particles to the substrates.

The chemical vapor deposition apparatus according to the present invention comprises: a substrate processing chamber for depositing a film on each of a plurality of substrates; a susceptor disposed in the substrate processing chamber to hold the plurality of substrates each placed with a surface thereof for deposition of the film facing downward; a heater disposed above the susceptor in the substrate processing chamber to heat at least one of the substrates; a first barrier gas supply port opened in an upper portion of the substrate processing chamber to supply a barrier gas to an upper surface of the susceptor; a second barrier gas supply port opened in the upper portion of the substrate processing chamber to supply the barrier gas to an upper surface of the heater; a raw-material-gas inlet port for supplying a raw material gas to a lower surface of the susceptor; and an exhaust pipe for exhausting the barrier gas and the raw material gas from the substrate processing chamber, wherein a flow rate of the barrier gas supplied from the first barrier gas supply port and the flow rate of the barrier gas supplied from the second barrier gas supply port are controlled independently.

The arrangement allows the amount of each of the barrier gas supplied from the first barrier gas supply port and the barrier gas supplied from the second barrier gas supply port to a desired value and thereby allows the ratio between the amount of the barrier gas supplied to the upper surface of the susceptor and the amount of the barrier gas supplied to the upper surface of the heater or the ratio between the amount of the barrier gas supplied from each of the first and second barrier gas supply ports and the amount of the supplied raw material gas to a proper value in accordance with the structure of the substrate processing chamber. As a result, it becomes possible to, e.g., adjust the pressure (atmospheric pressure) applied to the upper surface of the susceptor such that it is equal to the pressure applied to the lower surface of the susceptor in the chemical vapor deposition apparatus according to the present invention. In this case, since the disturbance of the flow of the raw material gas can be prevented, the reaction product that has adhered to the wall surface of the substrate processing chamber and to the member therein is prevented from being scattered and landing on the substrate surfaces as particles. Since the adhesion of the reaction product to the surface of the heater is prevented, temperature control in the substrate processing chamber can also be performed with high accuracy. Accordingly, the use of the chemical vapor deposition apparatus according to the present invention enables the formation of high-quality films with reduced contamination resulting from the particles.

The first barrier gas supply port is annularly opened in a center region of the upper portion of the substrate processing chamber, the second barrier gas supply port is annularly opened in the center region to surround the first barrier gas supply port, and the raw-material-gas inlet port is provided below the susceptor. The arrangement allows uniform and even supply of the raw material gas to the plurality of substrates and also allows the barrier gas to flow along the upper surface of the heater, the upper surface of the susceptor, and the sidewall of the substrate processing chamber without disturbance.

A film deposition method according to the present invention uses a chemical vapor deposition apparatus comprising: a substrate processing chamber; a susceptor; a heater disposed above the susceptor in the substrate processing chamber; a first barrier gas supply port opened in an upper portion of the substrate processing chamber; a second barrier gas supply port opened in the upper portion of the substrate processing chamber; and a raw-material-gas inlet port and comprises the steps of: (a) placing each of a plurality of substrates in the susceptor with a surface of the substrate for deposition of the film facing downward; (b) after the step (a), supplying a barrier gas to an upper surface of the susceptor from the first barrier gas supply port and supplying, from the second barrier gas supply port, the barrier gas having a flow rate thereof controlled independently of a flow rate of the barrier gas supplied from the first barrier gas supply port to an upper surface of the heater; and (c) simultaneously with the step (b), supplying a raw material gas from the raw-material-gas inlet port to a lower surface of the susceptor to deposit the film on the substrate.

The method allows the setting of the flow rate ratio between the barrier gas supplied from the first barrier gas supply port and the barrier gas supplied from the second barrier gas supply port to a proper value in the step (b) and allows the barrier gas to flow toward the exhaust pipe without causing a turbulent. Since the flow of the raw material gas can be changed to a laminar flow, the scattering of the reaction product formed on the sidewall of the substrate processing chamber or the like is prevented and the adhesion of the reaction product in the form of particles to the substrate surface is also prevented.

For example, the flow rate of the barrier gas supplied from the first barrier gas supply port and the flow rate of the barrier gas supplied from the second barrier gas supply port are preferably controlled to be equal in the step (b). In accordance with the method, each of the barrier gas flowing from the upper surface of the heater along the wall surface of the substrate processing chamber and the barrier gas flowing from the upper surface of the susceptor along the wall surface of the substrate processing chamber can be exhausted without disturbance. As a result, the flow of the raw material gas is no more disturbed by the flow of the barrier gas and the adhesion of the reaction product to the sidewall of the substrate processing chamber can be suppressed. Thus, the method can prevent the adhesion of the reaction product to the substrate as particles.

For example, the flow rate of the barrier gas supplied from the first barrier gas supply port is controlled in the step (b) such that a flow rate of the barrier gas per unit capacity in a space between a lower surface of the heater and the upper surface of the susceptor is equal to a flow rate of the raw material gas per unit capacity in a space between the lower surface of the susceptor and the substrate processing chamber in the step (c). This allows the adjustment of the atmospheric pressure to be equal in each of the spaces over and under the susceptor. In accordance with the method, it becomes possible to prevent the raw material gas from leaking upwardly through the gap between the susceptor and the substrate. This prevents the flow of the raw material gas from being disturbed and prevents the reaction product adhered to the wall surface of the substrate processing chamber and the member therein from being scattered and landing on the substrate surface as particles. Since the adhesion of the reaction product to the surface of the heater can be prevented, temperature control in the substrate processing chamber can be performed with high accuracy. Thus, the use of the film deposition method according to the present invention allows the formation of a high-quality film with reduced contamination resulting from the particles.

DESCRIPTION OF THE PREFERRED EMBODIMENTS

Embodiment of Chemical Vapor Deposition Apparatus of Present Invention

Figure 1A:
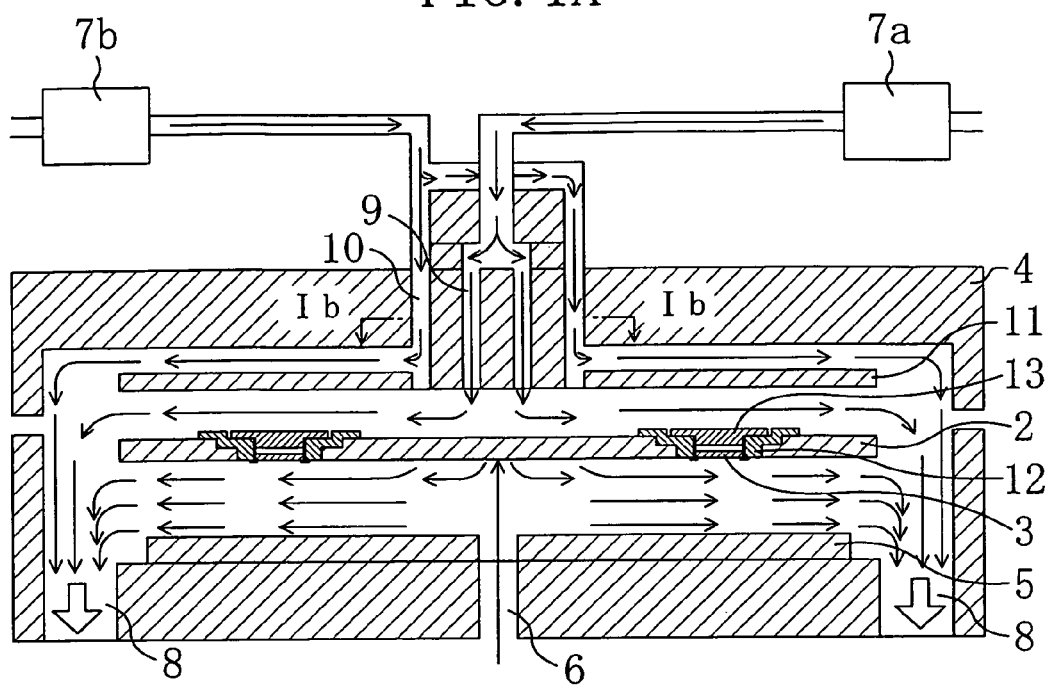
FIG. 1A is a cross-sectional view showing a structure of a chemical vapor deposition apparatus according to an embodiment of the present invention and FIG. 1B is a view showing a cross section of the chemical vapor deposition apparatus taken along the line Ib—Ib of FIG. 1A.
Figure 1B:
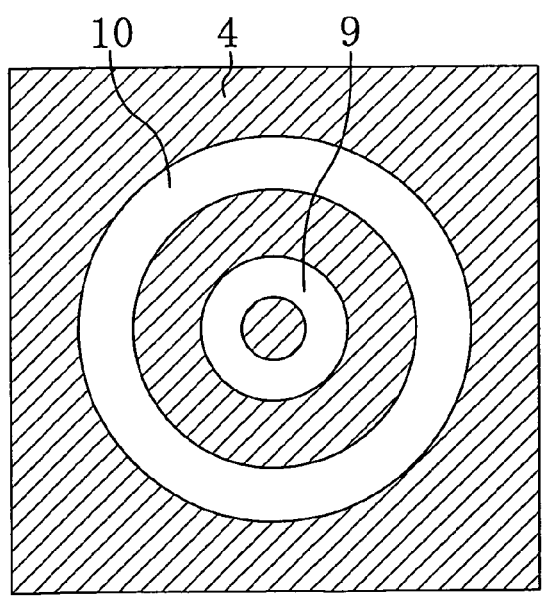

FIG. 1A is a cross-sectional view showing a structure of a chemical vapor deposition apparatus according to an embodiment of the present invention. FIG. 1B is a view showing a cross section of the chemical vapor deposition apparatus taken along the line Ib—Ib of FIG. 1A. An MOCVD apparatus is shown herein as an example of the chemical vapor deposition apparatus.

As shown in FIGS. 1A and 1B, the chemical vapor deposition apparatus according to the present embodiment comprises: a vacuum processing chamber (substrate processing chamber) 4 for performing thin film deposition on each of substrates 3; a susceptor 2 disposed in the vacuum processing chamber 4 to hold each of the substrates 3 with the thin-film deposition surface thereof facing downward;

trays 12 provided in the susceptor 2 to fix the substrates 3 to the susceptor 2; heating plates 13 held by the trays 12; heaters 11 disposed above the susceptor 2 to heat the substrates 3; and opposing plates 5 disposed below the susceptor 2, i.e., on the lower surface of the inner wall of the vacuum processing chamber 4. The chemical vapor deposition apparatus according to the present embodiment also comprises: a raw-material-gas inlet pipe 6 for supplying a raw material gas into the vacuum processing chamber 4; a first barrier gas supply port 9 annularly opened in the upper center portion of the vacuum processing chamber 4 to supply a barrier gas into the vacuum processing chamber 4; a second barrier gas supply port 10 annularly opened in the upper center portion of the vacuum processing chamber 4 to surround the first barrier gas supply port 9 and supply the barrier gas to the vacuum processing chamber 4; a first MFC 7a for controlling the flow rate of the barrier gas flowing through the first barrier gas port 9; a second MFC 7b for controlling the flow rate of the barrier gas flowing through the second barrier gas supply port 10; and exhaust pipes 8 each for exhausting the raw material gas and the barrier gas from the vacuum processing chamber 4. In the example shown in FIG. 1B, the first and second barrier gas supply ports 9 and 10 are concentrically opened. The susceptor 2 has a circular configuration and a plurality of substrates 3 can be disposed thereon. The raw-material-gas inlet pipe 6 is opened immediately below the center portion of the susceptor 2.

Figure 2A:
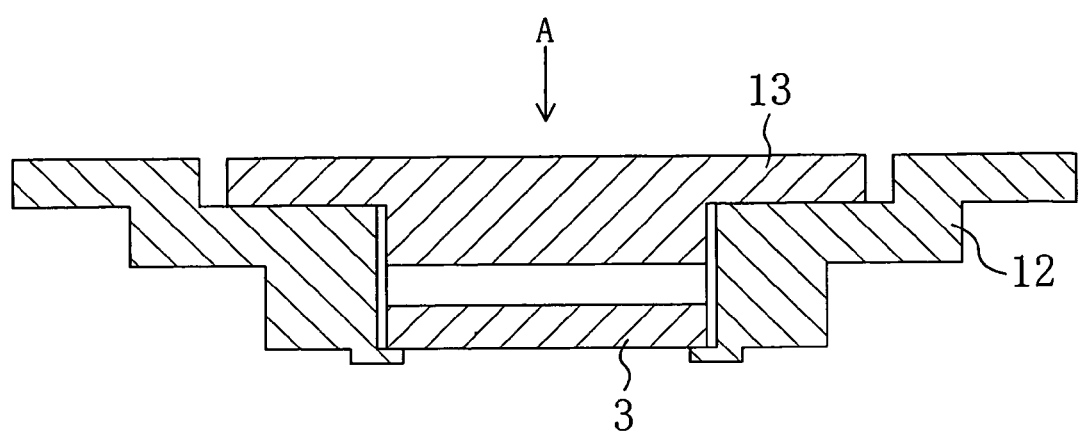
FIG. 2A is a view showing a substrate holding portion and its periphery in the chemical vapor deposition apparatus according to the embodiment shown in FIG. 1A
Figure 2B:
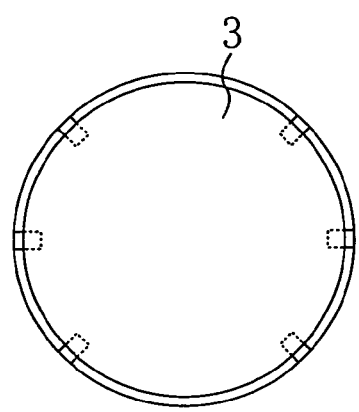
FIG. 2B is a plan view when the substrate is viewed from thereabove in the state without a tray.

FIG. 2A is a view showing a portion for holding the substrate 3 and its periphery in the chemical vapor deposition apparatus according to the present embodiment shown in FIG. 1A. FIG. 2B is a plan view when the substrate 3 is viewed from above (from the point A shown in FIG. 2A) in the state without the heating plate 13. As shown in the drawings, the substrate 3 is fixed in place with the thin-film deposition surface thereof facing downward by using the tray 12 having a plurality of claws. A gap is formed between the substrate 3 and the tray 12.

In the case of depositing a thin film by using the chemical vapor deposition apparatus according to the present embodiment, the vacuum processing chamber 4 is reduced in pressure with the substrates 3 being placed on the susceptor 2 and a raw material gas is supplied from the raw-material-gas inlet pipe 6 into the vacuum processing chamber 4, while the barrier gas is supplied from each of the first and second barrier gas supply ports 9 and 10 into the vacuum processing chamber 4. The raw material gas ejected from the raw-material-gas inlet pipe 6 has undergone a mixing process in the pipe and flows radially from the center of the lower surface of the susceptor 2. The raw material gas is then exhausted from the plurality of exhaust pipes 8 provided at different locations. In this case, the substrates 3 have been heated by using the heaters 11 so that thin films are deposited on the lower surfaces of the substrates 3. The barrier gas supplied from the first barrier gas supply port 9 flows radially from the center portion of the upper surface of the susceptor 2 in the space between the lower surfaces of the heaters 11 and the upper surface of the susceptor 2 along the susceptor 2 and then flows downward along the sidewalls of the vacuum processing chamber 4 to be exhausted through the exhaust pipes 8. On the other hand, the barrier gas supplied from the second barrier gas supply port 10 flows between the upper wall of the vacuum processing chamber 4 and the upper surfaces of the heaters 11 toward the sidewalls of the vacuum processing chamber 4 and then flows downward along the sidewalls to be exhausted through the exhaust pipes 8.

In the thin film deposition method according to the present embodiment, the total flow rate of the barrier gas supplied is adjusted to 20 (L/min) and the flow rate of the barrier gas supplied from each of the first and second barrier gas supply ports 9 and 10 is controlled to be 10 (L/min) by using the first or second MFC 7a or 7b. That is, the flow rate ratio between the barrier gas supplied from the first barrier gas supply port 9 and the barrier gas supplied from the second barrier gas supply port 10 is set to 1:1. On the other hand, the flow rate of the raw material gas is controlled to 50 (L/min). The setting of the flow rate of each of the barrier gas and the raw material gas will be described later in detail. In the case of forming a compound semiconductor film, hydrogen, e.g., or the like is used as the barrier gas, while a gas mixture of a metal organic compound such as trimethylgallium (TMGa) and phosphine, arsine, or the like is used as the raw material gas.

The use of the chemical vapor deposition apparatus according to the present embodiment allows individual control of the flow rate of the barrier gas supplied from the first barrier gas supply port 9 and the flow rate of the barrier gas supplied from the second barrier gas supply port 10 during the film deposition described above by using the first and second MFCs 7a and 7b. By setting each of the flow rate ratio between the barrier gas supplied from the first barrier gas supply port 9 and the barrier gas supplied from the second barrier gas supply port 10 and the flow rate ratio between the barrier gas supplied from the second barrier gas supply port 10 and the raw material gas supplied from the raw-material-gas inlet pipe 6 to a proper value, therefore, it becomes possible to prevent the raw material gas from leaking upwardly into the space over the substrates 3 through the gaps between the substrates 3, the susceptor 2, the trays 12, and the heating plates 13. This allows the raw material gas flowing through the space between the thin-film deposition surfaces of the substrates 3 and the opposing plates 5 to form a laminar flow. Preferably, the amount of the barrier gas supplied from the second barrier gas supply port 10 is determined such that the flow rate of the barrier gas per unit capacity in the space between the upper surface of the susceptor 2 and the lower surfaces of the heaters 11 is equal to the flow rate of the raw material gas per unit capacity in the space between the lower surface of the susceptor 2 (and the lower surfaces of the substrates 3) and the lower wall of the vacuum processing chamber 4 (or the opposing plates 5). By thus setting the flow rates, it becomes possible to prevent the delamination of a reaction product adhered to the opposing plates 5 and prevent the adhesion of the particles of the reaction product to the deposition surfaces of the substrates 3. By adjusting the flow rate of the barrier gas supplied from the first barrier gas supply port 9 such that it is equal to the flow rate of the barrier gas supplied from the second barrier gas supply port 10, it becomes possible to suppress the occurrence of a turbulent at each of the portions of the sidewalls of the vacuum processing chamber 4 on which the barrier gas flowing along the upper surfaces of the heaters 11 and the barrier gas flowing along the upper surface of the susceptor 2 impinge and thereby prevent the adhesion of the reaction product to the portions.

A description will be given herein to grounds for thus setting the respective flow rates of the barrier gas and the raw material gas.

As a result of research, the present inventors have found that it is necessary to prevent the raw material gas supplied from below the substrates 3 from leaking upwardly into the space over the substrates 3 through the gap formed in the vicinity of the position where each of the substrates 3 is placed as a first condition for changing the flow of each of the raw material gas and the barrier gas into a laminar flow. If the atmospheric pressure is equal in the space under the substrates 3 and the susceptor 2 and in the space over the susceptor 2, therefore, it is presumably possible to prevent the raw material gas from leaking upwardly into the space over the substrates 3. To provide an equal atmospheric pressure in each of the space under the susceptor 2 and the space over the susceptor 2, the flow rate of the raw material gas in per unit capacity in the space under the susceptor 2 may be adjusted appropriately to be equal to the flow rate of the barrier gas per unit capacity in the space over the susceptor 2. The flow rate of each of the raw material gas and the barrier gas per unit capacity can be determined by using the capacity of the space through which the raw material gas ejected from the raw-material-gas inlet pipe 6 passes before reaching the exhaust pipe 8, the capacity of the space through which the barrier gas passes from the center of the upper surface of the susceptor 2 before reaching the exhaust pipe 8, and the respective amounts of the raw material gas supplied and the barrier gas supplied. In the chemical vapor deposition apparatus according to the present embodiment, the capacity ratio between the space through which the raw material gas ejected from the raw-material-gas inlet pipe 6 passes before reaching the exhaust pipe 8 and the space through which the barrier gas passes from the center of the upper surface of the susceptor 2 before reaching the exhaust pipe 8 is approximately 5:1. In the chemical vapor deposition apparatus according to the present embodiment, therefore, it becomes possible to suppress the occurrence of a turbulent and greatly reduce the number of particles adhered to the thin-film deposition surface of each of the substrates 3 by adjusting the flow rate ratio between the raw material gas supplied from the raw-material-gas inlet pipe 6 and the barrier gas supplied from the second barrier gas supply port 10 to approximately 5:1. Since the reaction product is less likely to adhere to the surfaces of the heaters 11, the accuracy of temperature control in the vacuum processing chamber 4 during film deposition can be enhanced.

It has also been found that the adjustment of the amount of the barrier gas supplied from the first barrier gas supply port 9 such that it is equal to the amount of the barrier gas supplied from the second barrier gas supply port 10 is also necessary as a second condition for changing the flow of each of the raw material gas and the barrier gas into a laminar flow. With such a setting, the flow rate of the barrier gas per unit capacity is equal at each of the portions of the sidewalls of the vacuum processing chamber 4 on which the barrier gas flowing along the upper surfaces of the heaters 11 and the barrier gas flowing along the upper surface of the susceptor 2 impinge. As a result, a turbulent no more occurs in the barrier gas flowing toward the exhaust pipe 8 along the sidewall of the vacuum processing chamber 4 and the raw material gas is exhausted without being disturbed by the barrier gas. This achieves a reduction in the reaction product adhered to the sidewall of the vacuum processing chamber 4 and a reduction in the number of particles adhered to each of the substrates 3.

By thus using the chemical vapor deposition apparatus according to the present embodiment, the provision of a plurality of gas supply ports for which flow rate control can be performed individually allows the barrier gas to be supplied at desired flow rates to the upper surfaces of the heaters 11 and to the upper surface of the susceptor 2. This reduces contamination resulting from the particles during thin film deposition and increases the production yield of a semiconductor device.

Although the thin film formation method according to the present embodiment has adjusted the amount of the supplied raw material gas to 50 (L/min) and the amount of each of the barrier gas supplied from the first barrier gas supply port 9 and the barrier gas supplied from the second barrier gas supply port 10 to 10 (L/min), the above-mentioned effects are obtainable even when the amount of each of the gases is varied provided that the same ratio is retained among the amounts of the gases supplied.

Although the first and second barrier gas supply ports 9 and 10 are opened concentrically in the chemical vapor deposition apparatus according to the present embodiment, the configuration of each of the openings is not limited to a concentric circle provided that it allows uniform and even supply of the barrier gas to the interior of the vacuum processing chamber 4.

Specific Example of Present Embodiment

Figure 3:
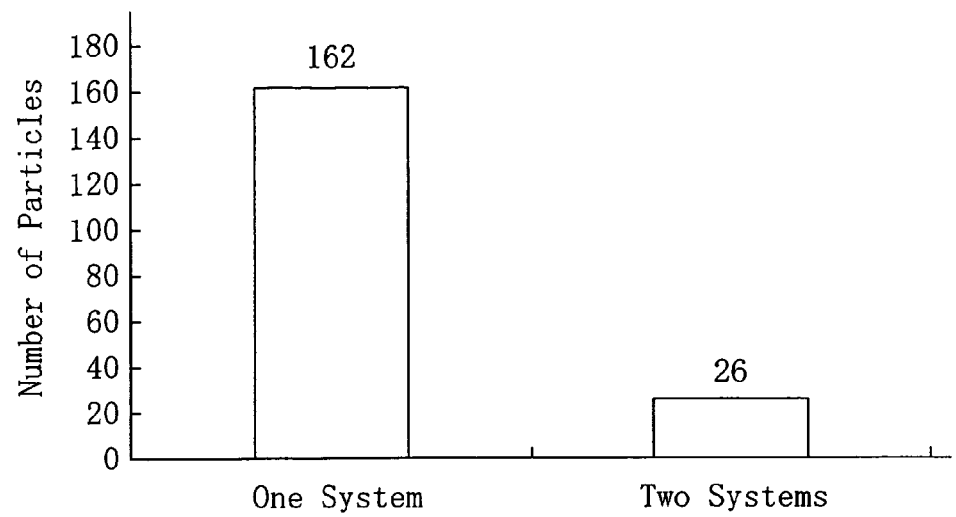
FIG. 3 is a view showing for comparison the respective numbers of particles adhered to substrates when thin film formation was performed by using the chemical vapor deposition apparatus according to the embodiment of the present invention and a conventional chemical vapor deposition apparatus.
Figure 4:
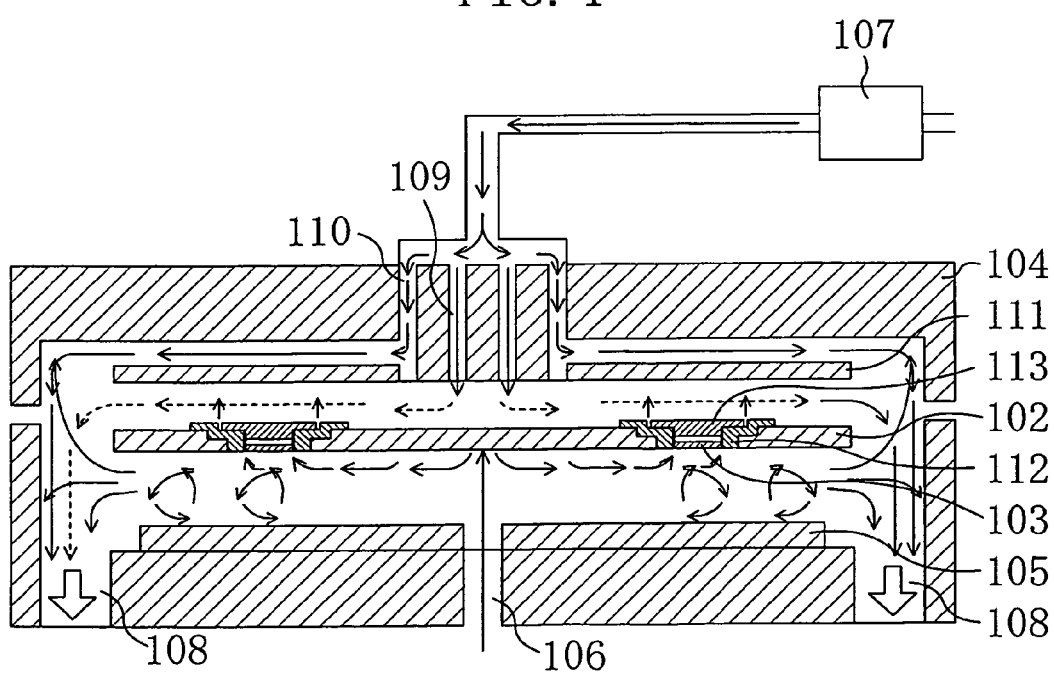
FIG. 4 is a cross-sectional view showing a structure of a conventional chemical vapor deposition apparatus

FIG. 3 is a view showing for comparison the respective numbers of particles adhered to the substrates 3 when thin film formation was performed by using the chemical vapor deposition apparatus according to the present embodiment and a conventional chemical vapor deposition apparatus. The thin film formation was performed under reduced pressure and the amount of the raw material gas supplied was adjusted to 50 (L/min), while the amount of each of the barrier gas supplied from the first barrier gas supply portion 9 and the barrier gas supplied from the second barrier gas supply portion 10 was adjusted to 10 (L/min).

According to the result of measurement shown in FIG. 3, the number of particles adhered to the substrate 3 and having grain diameters of 0.5 $\mu$m or more was 162 in the conventional apparatus having only one system for supplying the barrier gas. By contrast, the number of particles adhered to the substrate 3 was 26 in the chemical vapor deposition apparatus having two systems for supplying the barrier gas according to the present embodiment and it was proved that the number of particles could be reduced to 16% of the number of particles adhered to the substrate 3 when the number of systems for supplying the barrier gas was one.

The chemical vapor deposition apparatus according to the present invention can be used for the manufacturing of a semiconductor device containing a semiconductor layer. In addition, the thin film deposition method according to the present invention can be used for a chemical vapor deposition apparatus having a structure in which a barrier gas is supplied from the center portion of a vacuum processing chamber.

What is claimed is:

1. A film deposition method using a chemical vapor deposition apparatus comprising: a substrate processing chamber; a susceptor; a heater disposed above the susceptor in the processing chamber; a first barrier gas supply port opened in an upper portion of the substrate processing chamber; and a raw-material-gas inlet port, the method comprising the steps of:

(a) placing each of a plurality of substrates in the susceptor with a surface of each substrate for deposition of the film facing downward;

(b) after the step (a), supplying a barrier gas to an upper surface of the susceptor from the first barrier gas supply port and supplying the barrier gas to an upper surface of the heater from the second barrier gas supply port, the barrier gas supplied from the second barrier gas supply port having a flow rate thereof controlled independently of a flow rate of the barrier gas supplied from the first barrier gas supply port; and (c) simultaneously with the step (b), supplying a raw material gas from the raw-material-gas inlet port to a lower surface of the susceptor to deposit the film on the substrate.

2. The film deposition method of claim 1, wherein the flow rate of the barrier gas supplied from the first barrier gas supply port and the flow rate of the barrier gas supplied from the second barrier gas supply port are controlled to be equal in the step (b).

3. The film deposition method of claim 1, wherein the flow rate of the barrier gas supplied from the first barrier gas supply port is controlled in the step (b) such that a flow rate of the barrier gas per unit capacity in a space between a lower surface of the heater and the upper surface of the susceptor is equal to a flow rate of the raw material gas per unit capacity in a space between the lower surface of the susceptor and the substrate processing chamber in the step (c).

* * * * *